United States Patent
Gureshnik et al.

(10) Patent No.: US 6,459,398 B1
(45) Date of Patent: Oct. 1, 2002

(54) PULSE MODULATED DIGITAL TO ANALOG CONVERTER (DAC)

(75) Inventors: Eran Gureshnik, Petah Tikva; Daniel Yellin, Ra'anana; Shlomo Yakobovich, Rosh Ha'ayin; Arie Stalberg, Yehud, all of (IL)

(73) Assignee: D.S.P.C. Technologies Ltd., Petach Tikva (IL)

( * ) Notice: Subject to any disclaimer, the term of this patent is extended or adjusted under 35 U.S.C. 154(b) by 0 days.

(21) Appl. No.: 09/357,235

(22) Filed: Jul. 20, 1999

(51) Int. Cl.[7] ............................................. H03M 1/66
(52) U.S. Cl. ...................................... 341/144; 341/145
(58) Field of Search .................................. 341/144, 152, 341/145, 131, 139, 138

(56) References Cited

U.S. PATENT DOCUMENTS

| | | | |
|---|---|---|---|
| 4,058,772 A | * 11/1977 | Mogi et al. | 341/145 |
| 4,818,996 A | * 4/1989 | Kimura | 341/144 |
| 4,857,926 A | * 8/1989 | Neglia et al. | 341/116 |
| 5,059,979 A | * 10/1991 | Micic et al. | 341/152 |
| 5,204,594 A | 4/1993 | Carobolante | |
| 5,207,091 A | * 5/1993 | Shibata et al. | 73/118.1 |
| 5,337,338 A | 8/1994 | Sutton et al. | |
| 5,469,164 A | 11/1995 | Kemp | |
| 5,617,060 A | 4/1997 | Wilson et al. | |
| 5,631,648 A | 5/1997 | Yamada et al. | |
| 5,712,636 A | 1/1998 | Buch | |
| 5,764,165 A | 6/1998 | Buch | |
| 5,774,084 A | 6/1998 | Brombaugh et al. | |
| 5,784,019 A | 7/1998 | Wong et al. | |

* cited by examiner

*Primary Examiner*—Peguy Jeanpierre
*Assistant Examiner*—Jean Bruner Jeanglaude
(74) *Attorney, Agent, or Firm*—Eitan, Pearl, Latzer & Cohen-Zedek

(57) ABSTRACT

A switchable low pass filter includes a first switch connected to a first resistive element, a second switch connected to a second resistive element, and a capacitive element connected to the first and second resistive elements. The switchable low pass filter also includes a controller connected to the first switch and the second switch, the controller operative to open and close at least one of the first switch and the second switch. A method for producing a pulse density modulated signal whose pulse timing is jittered includes the following steps; adding a substantially random number and a multi-bit number to a value stored in a flip flop, thereby producing a sum; if the sum is less than an upper limit, storing the sum in the flip flop, thereby replacing the value; if the sum is not less than the upper limit, producing a pulse, subtracting the upper limit from the sum, thereby producing a result, and storing the result in a flip flop; and repeating the steps.

11 Claims, 5 Drawing Sheets

PULSE MODULATED DIGITAL TO ANALOG CONVERTER (DAC)

FIELD OF THE INVENTION

The present invention relates to digital to analog converters, in general, and to pulse density modulation (PDM) digital to analog converters, in particular.

BACKGROUND OF THE INVENTION

As part of the ever present drive to reduce the post, size and power consumption of electronic devices, smaller and simpler components are being used in the design of these devices. Some of these components are driven by analog control signals and require a stable, high-resolution analog control signal in order to work efficiently. The analog control signals are typically produced by digital to analog converters (DACs). In portable cellular telephones, for example, analog control signals are used to determine the working point of a transmission Automatic Gain Control (AGC), which controls the power of an amplifier of a transmitting device. Analog control signals are also used to determine the working point of a voltage-controlled temperature-compensated oscillator (VCTCXO), which is used to modulate the transmitted signal and to demodulate the received signal.

Conventional DACs use various circuits that are known in the art, for example, resistor ladders. Analog circuits such as resistor ladders require a large silicon area when implemented into an integrated complementary metal oxide semiconductor (CMOS) circuit, a factor which becomes much more significant from a rest perspective when small submicron CMOS technology is used.

Digital to analog converters (DAC) based on pulse width modulation (PWM) or pulse density modulation (PDM) methods are known in the art. The PDM method is described in U.S. Pat. No. 5,337,338 to Sutton et al. A pulse modulated DAC comprises a digital circuit which converts a multi-bit digital signal to a single bit digital signal, followed by an analog low pass filter (LPF) which converts the single hit digital signal to a constant level analog signal. The LPF filters out the undesired high frequencies in the single bit digital signal. A simple and economical way to implement a low pass filter is by using one resistor and one capacitor.

The purpose of the analog LPF is to produce a stable analog signal output that is the average of the discrete levels of the single bit digital signal input. One of the disadvantages of the PWM and PDM methods is that the analog signal output is not constant, but rather has an inherent harmonic ripple in it due to the charging and discharging of the capacitor. This ripple adversely affects the analog components controlled by the analog signal output. For example, a ripple imposed onto an AGC modulates the carrier frequency and generates undesired spurious transmission signals. A ripple imposed onto a VCTCXO will generate spurious replicas of the desired transmission signal at multiples of the ripple frequency, and will interfere with the desired received signal. Another disadvantage is that when the pulse modulated signal changes to represent a different multi-bit digital signal, a relatively long response time is required until the LPF output reaches the new desired value. These two disadvantages are related: trying to reduce the ripple by decreasing the cutoff frequency results in a slower response time.

Various digital to analog converters, using PWM or PDM methods, are described in the U.S. Pat. No. 5,774,084 to Brombaugh et al., U.S. Pat. No 5,764,165 to Buch, U.S. Pat. No. 5,712,636 to Buch, and U.S. Pat. No. 5,784,019 to Wong et al. U.S. Pat. No. 5,617,060 to Wilson et al. describes an automatic gain control (AGC) and DC offset correction method and apparatus that uses PDM and a conventional low pass filter. U.S. Pat. No. 5,204,594 to Carbolante discloses a circuit for providing a signal proportional to the average current flowing through coils of a motor operated in both linear and PWM modes.

BRIEF DESCRIPTION OF THE DRAWINGS

The present invention will be understood and appreciated more fully from the following detailed description taken in conjunction with the appended drawings in which like reference characters identify correspondingly throughout and wherein.

DETAILED DESCRIPTION OF THE PRESENT INVENTION

The present invention is directed to a digital to analog converter (DAC) and to methods of operating a digital to analog converter. The DAC of the present invention is small in size due to the small number of analog components and has relatively low power consumption.

Figure 1:
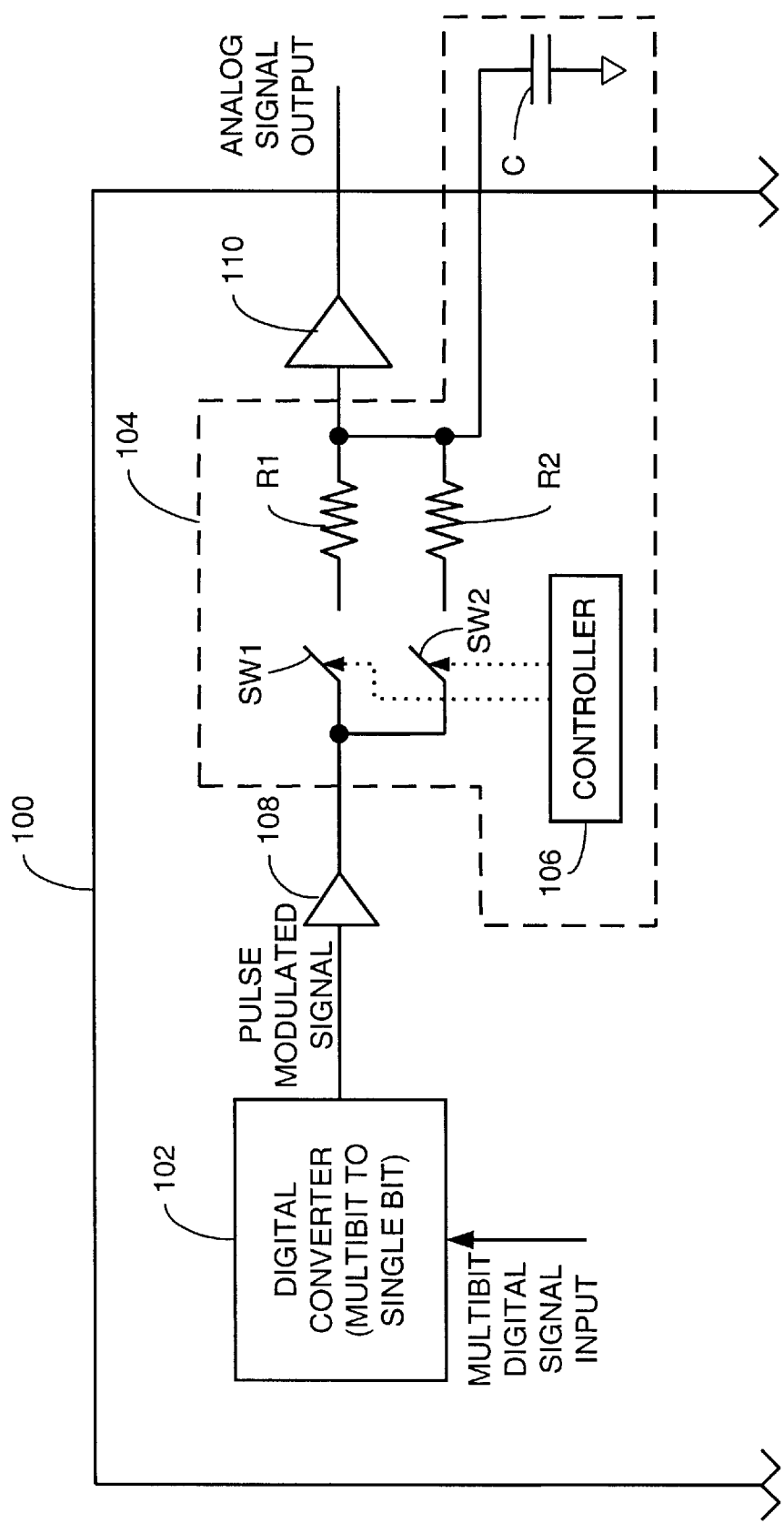
FIG. 1 is a schematic illustration of a portion of an integrated circuit having a DAC of an embodiment of the present invention implemented in it.
Figure 2A:
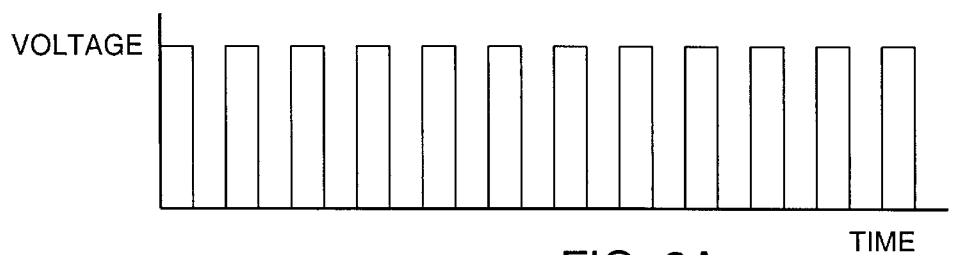
FIG. 2A is an exemplary graphical illustration of a pulse modulated signal as a function of time.
Figure 2B:
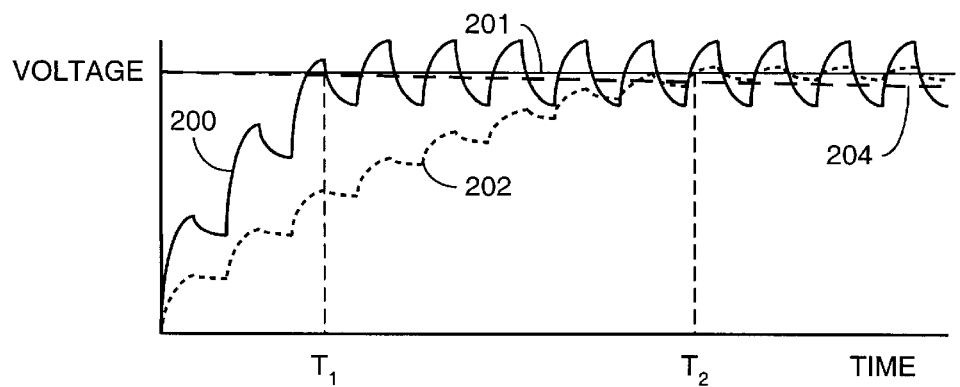
FIGS. 2B, 2C and 2D are exemplary graphical illustrations of the output analog signal of FIG. 1 as a function of time.
Figure 2C:
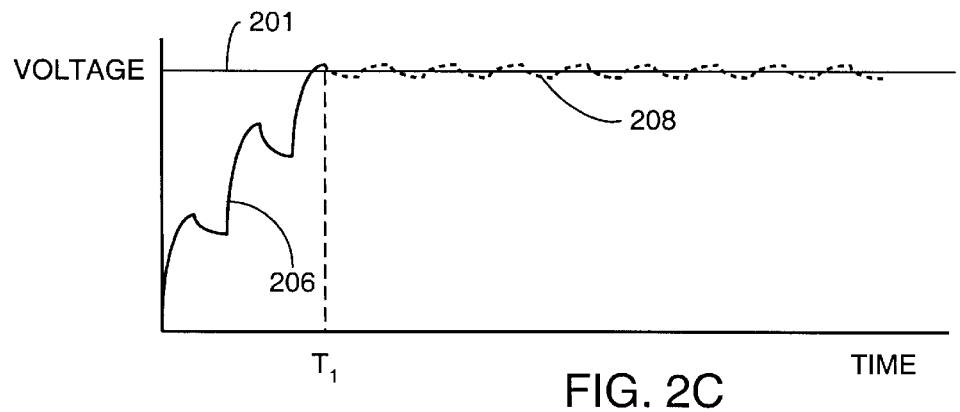
Figure 2D:
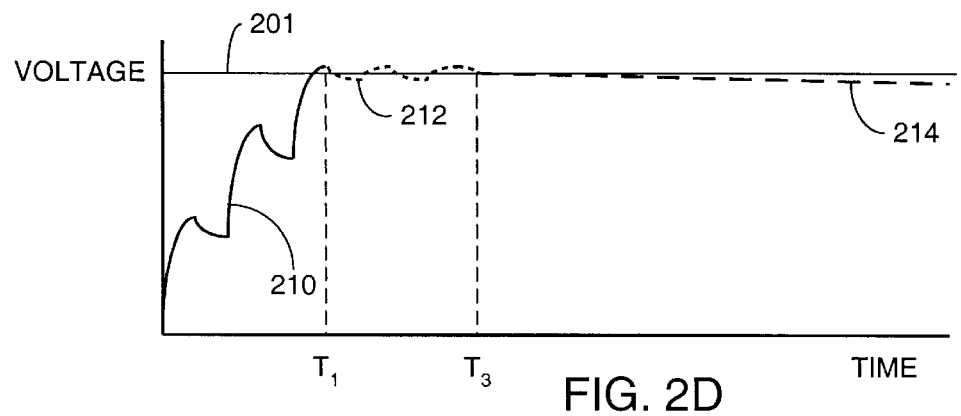

Reference is now made to FIG. 1, which is a schematic illustration of a portion of an integrated circuit 100, having a DAC of an embodiment of the present invention implemented in it. Reference is made additionally to FIG. 2A, which is an exemplary graphical illustration of a pulse modulated signal as a function of time, and to FIGS. 2B, 2C and 2D, which are exemplary graphical illustrations of the output analog signal of FIG. 1 as a function of time. In FIGS. 2B, 2C and 2D, the horizontal line 201 indicates the desired constant analog signal.

The DAC comprises a digital converter 102, a switchable low pass filter (LPF) 104, an amplifier 108 and a buffer 110. The digital converter 102 converts a multi-bit digital signal to a single bit digital signal, for example using pulse width modulation (PWM) or pulse density modulation (PDM) methods to create a pulse modulated signal.

The switchable LPF 104 receives the single bit digital signal and produces an analog signal. The switchable LPF 104 comprises a first switch SW1 connected to a first resistor R1, a second switch SW2 connected to a second resistor R2, a capacitor C connected serially to resistors R1 and R2, and a controller 106. The resistors R1 and R2 are connected in parallel. The resistance of the first resistor R1 is small relative to the resistance of the second resistor R2. In a non-limiting example, the resistance of the first resistor R1 is ten times smaller than the resistance of the second resistor R2.

The controller 106 is operative to open and close switches SW1 and SW2, thereby creating one of three modes of operation of the low pass filter 104.
a) Fast Response-large Ripple Mode When the switch SW1 is closed and the switch SW2 is open, the low pass filter formed by the resistor R2 and the capacitor C has a fast response time $T_1$, and a large ripple in the steady-state. This is shown in FIG. 2B by the solid line graph 200. As is known in the art, the ripple frequency coincides with the pulse frequency.
b) Slow Response-small Ripple Mode When the switch SW1 is open and the switch SW2 is closed, the low pass filter formed by the resistor R2 and the capacitor C has a slow response time $T_2$, and a small ripple in the steady-state. This is shown in FIG. 2B by the dotted-line graph 202. As is known in the art, the ripple frequency coincides with the pulse frequency.
c) Hold Mode When both the switches SW1 and SW2 are open, the capacitor C is in hold mode, and its voltage level remains almost steady, decreasing slowly in time due to parasitic leakage and leakage through the resistors and switches. This is shown in FIG. 2B by the flat dashed line 204.

According to an embodiment of the present invention, the DAC achieves a fast response time and a small ripple in the steady-state. When the multi-bit digital signal changes, resulting in a new single bit digital signal, the controller 106 closes switch SW1 and opens switch SW2 so that the capacitor C will charge in the fast response mode. This is shown in FIG. 2C by the solid-line graph 206. When the capacitor C reaches the desired voltage level at time $T_1$, the controller 106 opens switch SW1 and closes switch SW2 so that the capacitor C will retain its desired voltage level with a small ripple. This is shown in FIG. 2C by the dotted-line graph 208. In such a way, the DAC takes advantage of the fast response mode while the capacitor C is charging, and takes advantage of the small ripple mode when the capacitor C is close to or already at the desired voltage level. As a result, the DAC of the present invention produces a far more stable analog control signal than that of a conventional pulse modulated DAC.

According to another embodiment of the invention, the DAC achieves a fast response time and no ripple in the steady-state. When the multi-bit digital signal changes, resulting in a new single bit digital signal, the controller 106 closes switch SW1 and opens switch SW2 so that the capacitor C will charge in the fast response mode. This is shown in FIG. 2D by the solid-line graph 210. When the capacitor C reaches the desired voltage level at time $T_1$, the controller 106 opens switch SW1 and closes switch SW2 so that the capacitor C will retain its desired voltage level with a small ripple. This is shown in FIG. 2D by the dotted-line graph 212. When a no-ripple, very stable analog signal is required at beginning at time $T_3$, the controller 106 opens both switches SW1 and SW2 so that the capacitor C will retain its voltage level in hold made. This is shown in FIG. 2D by the almost flat dashed line 214.

The motivation for this embodiment is that there are cases, such as control signals for time division multiple access (TDMA) applications, where a very stable, slowly decreasing signal is preferable to even a small ripple. In such applications, the controller is set so that the time $T_3$ precedes or substantially coincides with the time at which the analog control signal is needed.

A further advantage of this embodiment is that during hold mode, the switchable LPF 104 draws no current, and the digital converter 102 can be turned off, resulting in a reduction in the overall power consumption.

Figure 3:
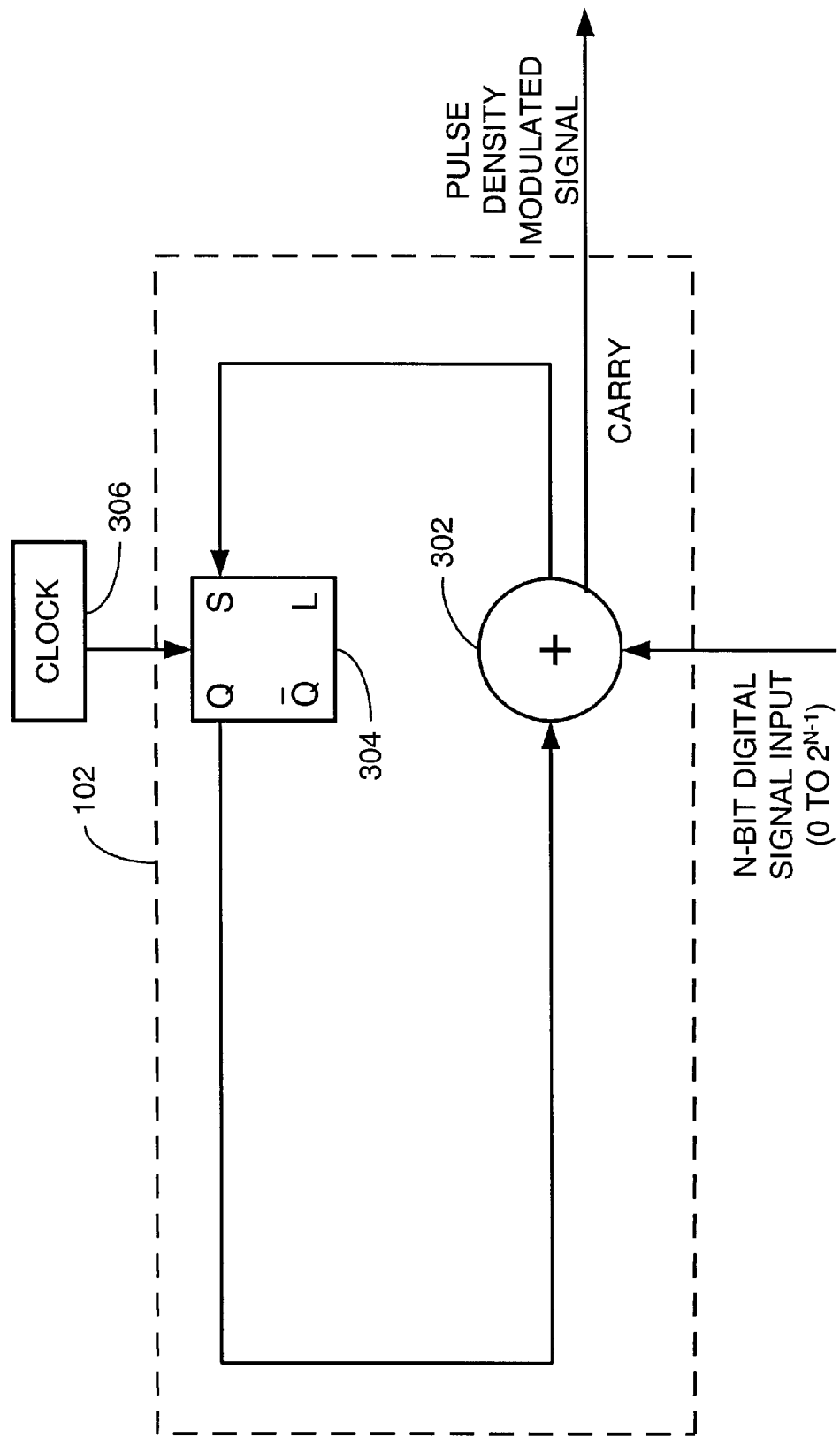
FIG. 3 is a schematic illustration of the digital converter of FIG. 1, according to an embodiment of the present invention.
Figure 4:
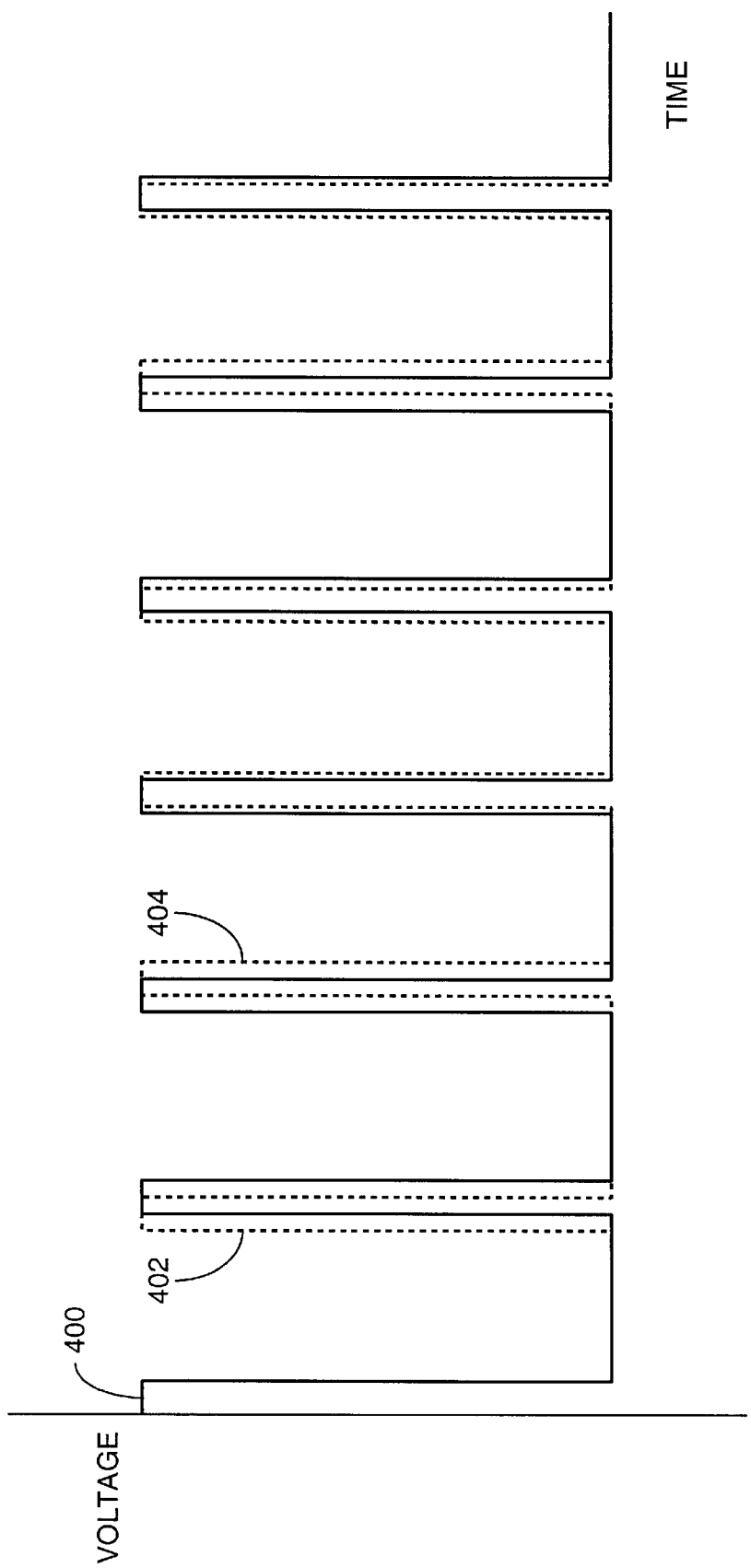
FIG. 4 is an exemplary graphical illustration of pulse modulated digital signals as a function of time.

The operation of the digital converter 102 of FIG. 1 will now be explained with respect to FIGS. 3 and 4, to which reference is now made, FIG. 3 is a schematic illustration of a pulse density modulation (PDM) digital converter, according to an embodiment of the present invention.

The digital converter 102 comprises an adder 302 and a flip-flop 304. Initially, the flip-flop has a value of 0. With each cycle of a clock 306, the adder 302 adds the N-bit digital signal input, which is a number having a value between 0 and $2^{N-1}$, to the value stored in the flip-flop 304. When the adder 302 reaches or passes the value $2^{N-1}$, a pulse is generated. Any remaining value of the adder 302 beyond $2^{N-1}$ is sent to the flip-flop 304 to be added in the next clock cycle. In such a way, a signal is generated with pulses whose density is proportional to the N-bit digital signal input. This signal is shown by the solid-line graph in FIG. 4, which is an exemplary graphical illustration of the voltage of the pulse modulated digital signal of FIG. 3 as a function of time.

Figure 5:
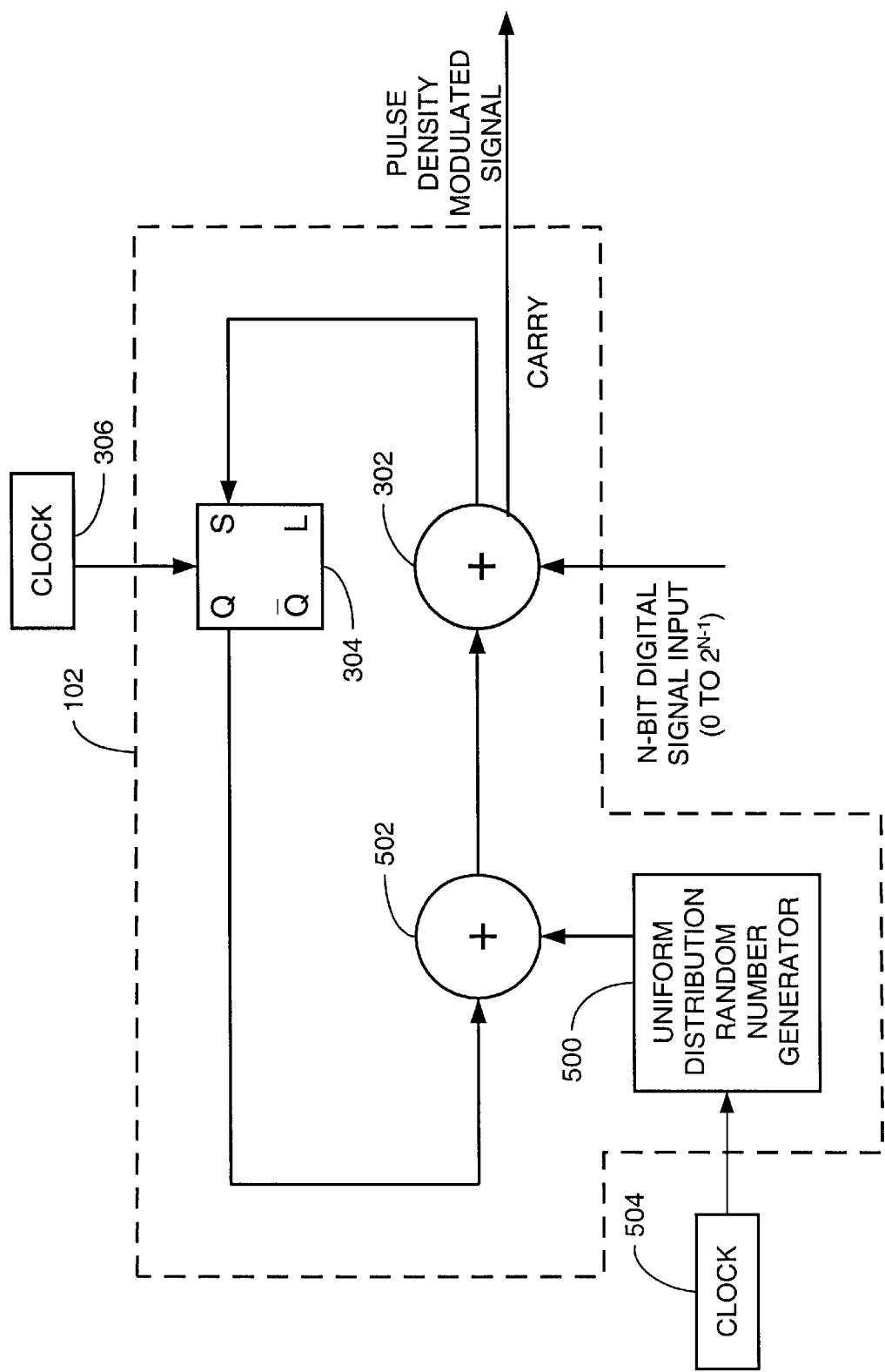
FIG. 5 is a schematic illustration of a modified version of the digital converter of FIG. 3, according to an embodiment of the present invention.

According to a further embodiment of the present invention, the DAC spreads the spectral properties of the harmonic ripple using random noise. As is known in the art, a PDM signal is composed of pulses whose density is proportional to the value of the multi-bit digital input signal. The frequency of these pulses, known as the ripple frequency, appears in the output analog signal and interferes with the desired signal. The same problem occurs with the output analog signal of a PWM signal, although its ripple frequency is generally lower than that generated by a PDM signal. In this embodiment of the present invention, the timing of the pulses in the pulse modulated signal is adjusted by a small, random factor, thereby spreading the spectral properties of the harmonic ripple. Reference is now made additionally to FIG. 5, which is a schematic illustration of a modified version of the digital converter of FIG. 3, according to a further embodiment of the present invention. In addition to the adder 302 and the flip-flop 304, the digital converter 102 comprises a uniform distribution random number generator 500 and an additional adder 502. The random number generator 500, for example a pseudo-random number (PN) generator, which is known in the art, is driven by a clock 604. For each cycle of the clock 504, the random number generator 500 generates a random number in the range −M to +M, where M is significantly smaller than N. The adder 502 adds the random number to the value in the flip-flop 304, and the result is added by the adder 302 to the N-bit digital signal input. The resulting pulse modulated signal is shown in FIG. 4 by the dashed-line graph. The effect is that the pulses generated by the digital converter of FIG. 5 are slightly offset in time ("jittered") from the pulses generated by the digital converter of FIG. 3. Sometimes, as in pulse 400, the two signals are coincident, sometimes, as in pulse 402, the jittered signal is early, and sometimes, as in pulse 404, the jittered signal is late. Introducing a small random noise into the pulse modulated signal spreads the spectral properties of the pulse frequency (which is the ripple frequency of the analog output signal produced by low pass filtering of the pulse modulated signal).

It will be appreciated by persons skilled in the art that the present invention is not limited by what has been particularly shown and described herein above. Rather the scope of the invention is defined by the claims that follow:

What is claimed is:

1. A switchable low pass filter comprising:
   a first switch connected to a first resistive element;
   a second switch connected to a second resistive element;
   a capacitive element connected to said first resistive element and to said second resistive element; and a controller coupled to said first switch and said second switch, said controller adapted to alter the effective resistance of said switchable low pass filter by opening or closing either of said switches.

2. A switchable low pass filter according to claim 1, wherein said first resistive element has a resistance which is smaller than the resistance of said second resistive element.

3. A device comprising:
- a plurality of resistive elements;
- at least one switch connected to one of said resistive elements;
- a capacitive element connected to said resistive elements thereby forming a low pass filter with said resistive elements; and
- a controller connected to said at least one switch, said controller operative to open and close said at least one switch thereby switching the resistance of said low pass filter.

4. A device comprising:
- a plurality of resistive elements;
- at least one switch connected to one of said resistive elements;
- a capacitive element connected to said resistive elements thereby forming a low pass filter with said resistive elements, said low pass filter having a response time; and
- a controller connected to said at least one switch, said controller operative to open and close said at least one switch thereby changing said response time.

5. A digital to analog converter comprising:
- a digital circuit which produces a pulse modulated signal; and
- a switchable low pass filter having a plurality of response times for converting said pulse modulated signal to an analog signal having ripples,
- wherein switching said low pass filter among said response times changes the size of said ripples.

6. A digital to analog converter according to claim 5, wherein said digital circuit is a pulse width modulation circuit.

7. A digital to analog converter according to claim 5, wherein said digital circuit is a pulse density modulation circuit.

8. A digital to analog converter according to claim 5, wherein said switchable low filter comprises:
- a first switch connected to a first resistive element;
- a second switch connected to a second resistive element;
- a capacitive element connected to said first resistive element and said second resistive element; and
- a controller connected to said first switch and said second switch, said controller operative to open and close at least one of said first switch and said second switch.

9. A digital to analog converter according to claim 8, wherein said first resistive element has a resistance which is smaller than the resistance of said second resistive element.

10. A device for producing a pulse density modulated signal whose pulse timing is jittered, the device comprising:
- a flip flop for storing a value;
- a random number generator for producing a substantially random number; and
- an adder for adding said substantially random number and a multi-bit number to said value, said adder having an upper limit,
- wherein a pulse is produced when the sum of said substantially random number, said multi-bit number and said value is not less than said upper limit.

11. A method for producing a pulse density modulated signal whose pulse timing is jittered, the method comprising the steps of:
- adding a substantially random number and a multi-bit number to a value stored in a flip flop, thereby producing a sum;
- if said sum is less than an upper limit, storing said sum in said flip flop, thereby replacing said value;
- if said sum is not less than said upper limit, producing a pulse;
- subtracting said upper limit from said sum, thereby producing a result; and
- storing said result in a flip flop; and repeating said steps.

* * * * *